United States Patent [19]
Yokota

[11] Patent Number: 5,936,534
[45] Date of Patent: Aug. 10, 1999

[54] ALARM CIRCUIT FOR RESIDUAL CAPACITY OF BATTERY IN PORTABLE RADIO TRANSMITTING AND RECEIVING APPARATUS

[75] Inventor: Hidetsugu Yokota, Saitama, Japan

[73] Assignee: NEC Corporation, Tokyo, Japan

[21] Appl. No.: 09/098,723

[22] Filed: Jun. 17, 1998

[30] Foreign Application Priority Data

Jun. 17, 1997 [JP] Japan ................................. 9-160095

[51] Int. Cl.⁶ ................................................. G08B 21/00
[52] U.S. Cl. ........................ 340/636; 340/539; 324/433; 320/48
[58] Field of Search .................... 340/636, 539; 324/426, 433, 435; 320/48

[56] References Cited

U.S. PATENT DOCUMENTS

| | | | |
|---|---|---|---|
| 5,032,825 | 7/1991 | Kuzuicki | 340/636 |
| 5,122,751 | 6/1992 | Aita et al. | 324/429 |
| 5,155,428 | 10/1992 | Kang | 320/13 |
| 5,166,623 | 11/1992 | Ganio | 324/427 |
| 5,239,286 | 8/1993 | Komatsuda | 340/636 |
| 5,333,176 | 7/1994 | Burke et al. | 379/58 |
| 5,392,462 | 2/1995 | Komaki | 455/89 |
| 5,424,722 | 6/1995 | Inada et al. | 340/636 |
| 5,541,489 | 7/1996 | Dunstan | 320/2 |
| 5,565,759 | 10/1996 | Dunstan | 320/48 |
| 5,570,025 | 10/1996 | Lauritsen et al. | 324/433 |
| 5,600,230 | 2/1997 | Dunstan | 320/48 |
| 5,684,404 | 11/1997 | Millar | 324/426 |
| 5,714,870 | 2/1998 | Dunstan | 320/43 |
| 5,726,636 | 3/1998 | Hayes, Jr. | 340/636 |
| 5,784,295 | 7/1998 | Hinohara | 364/550 |

FOREIGN PATENT DOCUMENTS 2 254 500  10/1992  United Kingdom .

Primary Examiner—Jeffery A. Hofsass
Assistant Examiner—Toan N. Pham
Attorney, Agent, or Firm—Scully, Scott, Murphy & Presser

[57] ABSTRACT

Voltage setting information designating a battery voltage for initiating alarming and alarm setting information designating a method for outputting the alarm are input from a keying section and variably stored in a memory. A computing section compares battery voltage information in a battery detected by a battery voltage detecting section with the voltage setting information and, when the voltage in the battery voltage information is lower than the voltage in the voltage setting information, outputs an alarm sound signal or a call incoming lamp signal based on the alarm setting information to give the alarm to a user by sounding the alarm using a sound source or by emitting light using a call incoming lamp. This construction enables the residual capacity of the battery, at which alarming is initiated, and a method for giving the alarm to be varied as desired by a user.

10 Claims, 2 Drawing Sheets

ALARM CIRCUIT FOR RESIDUAL CAPACITY OF BATTERY IN PORTABLE RADIO TRANSMITTING AND RECEIVING APPARATUS

FIELD OF THE INVENTION

The invention relates to an alarm circuit for the residual capacity of a battery in a portable radio transmitting and receiving apparatus, and more particularly to an alarm circuit, for the residual capacity of a battery, that monitors the output voltage of a battery used as a power source of a portable radio transmitting and receiving apparatus and, upon detection of a signal informing that the voltage approaches the lowest usable voltage of the portable radio transmitting and receiving apparatus, gives the alarm to a user.

BACKGROUND OF THE INVENTION

A conventional alarm circuit for the residual capacity of a battery in a portable radio transmitting and receiving apparatus, when the residual capacity of the battery loaded in the apparatus lowers and reaches a given voltage value or less during talking, sounds an alarm from a sound source to inform the user of the apparatus that the residual capacity of the battery will soon become zero, and, a predetermined given period of time after the initiation of sounding of the alarm, breaks the circuit of a power source of the apparatus.

In the conventional alarm circuit for the residual capacity of a battery in a portable radio transmitting and receiving apparatus, wherein the circuit of the power source of the apparatus is broken a predetermined period of time after the initiation of sounding of the alarm, however, there are disadvantages in that the time taken from the beginning of sounding of the alarm to the breaking of the circuit of the power source is so short that there is a possibility that necessary talking cannot be conducted. An additional problem of the conventional alarm circuit is that once the alarm begins to sound, the sounding of the alarm continues until the circuit of the power source is broken, making it difficult to catch what the person talks.

SUMMARY OF THE INVENTION

Accordingly, it is an object of the invention to provide an alarm circuit for the residual capacity of a battery in a portable radio transmitting and receiving apparatus that, through selection, by a user, of the residual capacity of the battery, at which an alarm begins to sound, and how to give the alarm, enables the alarm to be sounded in an earlier stage or enables the problem of the difficulty of catching the voice on the apparatus created by the alarm sound to be solved.

According to the first feature of the invention, an alarm circuit for the residual capacity of a battery in a portable radio transmitting and receiving apparatus, comprising:
 a memory for storing an alarm voltage of the battery, and an alarm selected from a sound alarm and a visual alarm;
 means for detecting a voltage of the battery to generate a detected voltage;
 means for comparing the detected voltage with the alarm voltage to generate an alarm signal, when the detected voltage is lower than the alarm voltage; and
 means for controlling one of a sound source and a display to be driven in accordance with the alarm selected from the sound alarm and the visual alarm, when the alarm signal is generated.

According to the second feature of the invention, an alarm circuit, for the residual capacity of a battery in a portable radio transmitting and receiving apparatus. which monitors the output voltage of a battery used as a power source of the portable radio transmitting and receiving apparatus and, upon detection of a signal informing that the voltage approaches the lowest usable voltage of the portable radio transmitting and receiving apparatus, gives the alarm to a user, comprises means, which registers voltage setting information for designating a battery voltage for initiating the alarming and registers alarm setting information for designating a method for outputting the alarm, and, based on the user's designation, can set, as desired, a margin time, defined as the time taken from the initiation of the alarming to the point of time when the portable radio transmitting and receiving apparatus becomes actually unusable, and a method for avoiding interference of speech with the alarm sound.

In the preferred embodiment, the alarming circuit comprises: memory means for storing the voltage setting information and the alarm setting information; and a keying section that permits the voltage setting information and the alarm setting information to be keyed by the user and be stored in the memory, and permits the voltage setting information and alarm setting information stored in the memory to be varied.

In the preferred embodiment, the alarming circuit further comprises: a computing section that compares the voltage in the registered voltage setting information with the current battery voltage detected from the battery and, when the current battery voltage is lower than the preset voltage, outputs an alarm sound signal based on the alarm setting information; and a sound source that sounds the alarm in response to the alarm sound signal.

In the preferred embodiment, as the alarm setting information, a call incoming lamp signal is output instead of the alarm sound signal to perform lighting or flashing of a call incoming lamp.

In the alarm circuit for the residual capacity of a battery in a portable radio transmitting and receiving apparatus, setting of high voltage as the battery setting information by inputting a higher voltage from the keying section permits an alarm to be sounded from the point of time when the residual capacity of the battery is larger. Further, the interference of voice during talking over the portable radio transmitting and receiving apparatus with the alarm sound can be avoided by setting the number of times of sounding of the alarm at a small value or by setting the flashing of the call incoming lamp as the alarm setting information.

BRIEF DESCRIPTION OF THE DRAWINGS

The invention will be explained in more detail in conjunction with the appended drawings, wherein.

DESCRIPTION OF THE PREFERRED EMBODIMENT

Figure 1:
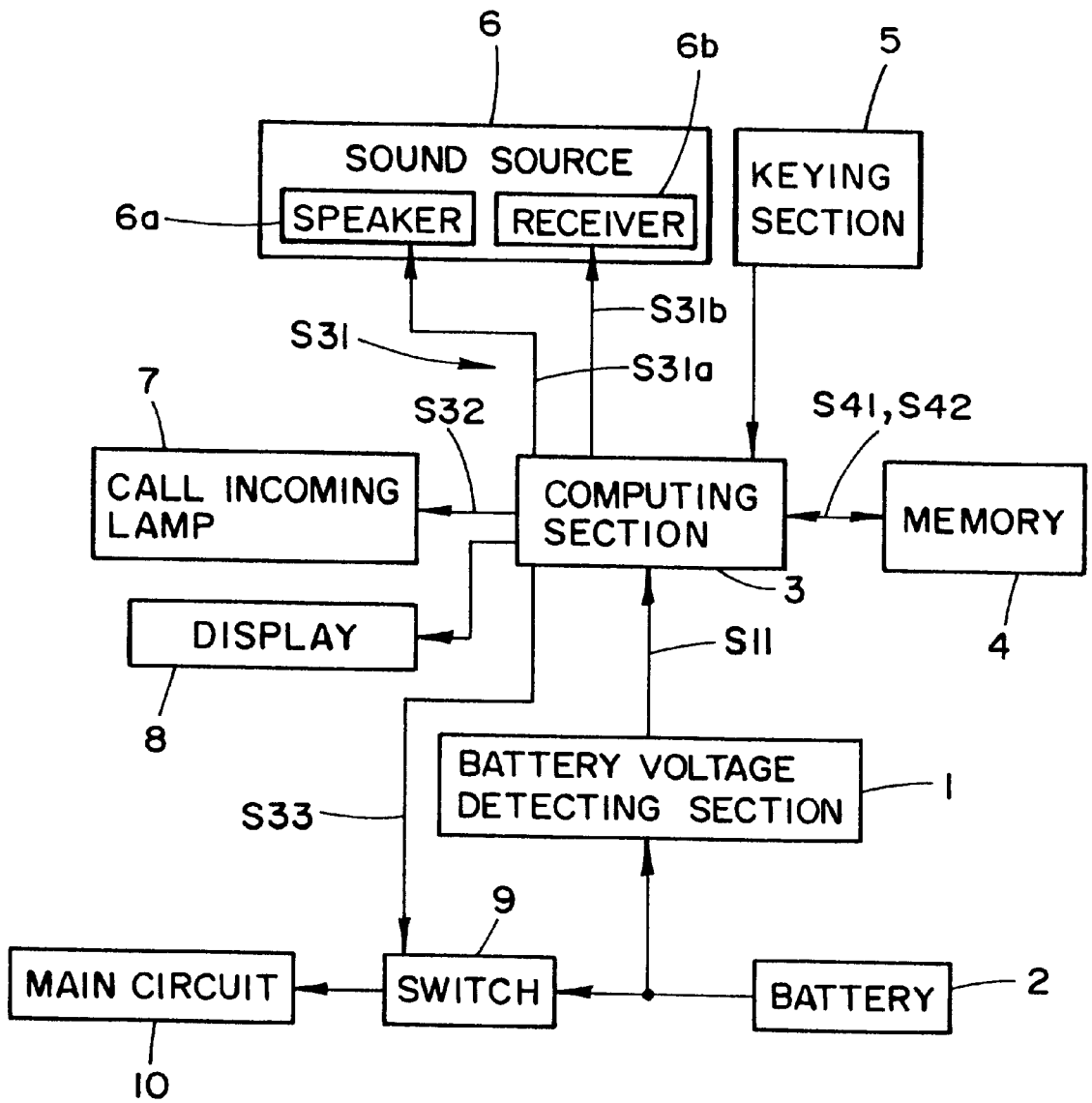
FIG. 1 is a block diagram showing a preferred embodiment of the invention, wherein only portions involved in the invention in a portable telephone set is illustrated.

FIG. 1 shows a preferred embodiment of the invention, wherein only portions involved in the invention in a portable radio transmitting and receiving apparatus (a portable telephone set) is illustrated. In FIG. 1, the alarm circuit for the residual capacity of a battery according to this preferred embodiment comprises: a battery voltage detecting section 1 which detects the voltage of a battery 2 as a power source of the portable telephone set and outputs battery voltage information S11 indicating the detected voltage value; memory 4 for storing voltage setting information S41 for designating a battery voltage value at which an alarm is given informing that the battery voltage approaches the lowest usable voltage of the portable telephone set. and alarm setting information S42 for designating a method for outputting the alarm; a keying section 5 that permits the voltage setting information S41 and the alarm setting information S42 stored in the memory 4 to be varied by keying; a computing section 3 that reads out the voltage setting information S41 from the memory 4, compares the voltage setting information S41 with battery voltage information S11, outputs an alarm sound signal S31 or a call incoming lamp signal S32 based on the alarm setting information S42 according to the results of the comparison, and outputs a switch control signal S33 a given period of time after the output of the alarm sound signal S31; a sound source 6 for sounding an alarm in response to the alarm sound signal S31; a call coming lamp 7 which is lighted in response to the call incoming lamp signal S32; a display 8 for displaying visible information such as letters, symbols or the like; and a switch 9 which, upon receipt of a switch control signal S33, permits or stops the feed of battery voltage into a main circuit 10 of the portable telephone set.

The input/output means, such as the keying section 5, the sound source 6, the call incoming lamp 7, and the display 8, can serve also as input/output means for various types of information associated with call originating and call incoming which are functions inherent in the portable telephone set. The construction and function of the other components of the portable telephone set are feasible using a well-known technique, and, hence, the explanation thereof will be omitted.

The operation of the alarm circuit for the residual capacity of a battery according to the preferred embodiment will be explained.

The battery voltage detecting section 1 detects the voltage of the battery 2 and sends battery voltage information S11 to the computing section 3. The keying section 5, when keyed by a user, can vary, through the computing section 3, the voltage setting information S41 and the alarm setting information S42 stored in the memory 4. In interlocking with the setting of the voltage setting information S41, the time taken from the beginning of alarming to the stop of feed of powder into the main circuit 10 is automatically set. The alarm information S42 can be selected from continuous sounding of an alarm. intermittent sounding of an alarm, and flashing of the call incoming lamp instead of sounding of the alarm and the like.

At the outset, the case where sounding of an alarm through the sound source 6 has been selected as the alarm setting information S42 will be explained. The computing section 3 reads out the voltage setting information S41 from the memory 4, compares the voltage setting information S41 with the battery voltage information S11, and, when the voltage in the battery voltage information S11 is higher than the voltage in the voltage setting information S41 (that is, when the operating time of the portable telephone set after replacement of the battery 2 or recharging is short), energizes the switch 9 in response to the switch control signal S33 so that the battery voltage is fed into the main circuit 10. In this case, the alarm is not sounded. On the other hand. when the voltage in the battery voltage information S11 is lower than or equal to the voltage in the voltage setting information S41 (when the operating time of the portable telephone set is long or when the voltage of the battery 2 is lowered), the computing section 3 reads out the alarm setting information S42 from the memory 4, and outputs the alarm sound signal S31 based on the alarm setting information S42 to sound an alarm through the sound source 6. A given period of time, based on the voltage setting information S41, after the beginning of sounding the alarm, the computing section 3 outputs a switch control signal S33 so that the switch 9 switches from the feed of battery voltage to the stop of the feed of battery voltage.

When flashing of the call incoming lamp 7 is set as the alarm setting information S42. the call incoming lamp 7 is flashed in response to the call incoming lamp signal S32 instead of sounding of the alarm through the sound source 6.

Method and means for setting various types of information and alarming will be explained in more detail.

Incorporation of the setting of the voltage setting information S41 and the alarm setting information S42, into software, as one of functions (functions that permit the user to perform various types of setting by keying F** or the like with examples thereof including the setting of call incoming sound volume) of the portable telephone set enables the user to vary the setting while watching a setting screen displayed on the display 8.

The value of the voltage setting information S41, which can be set by the user, may be, for example, an integer in the range of 0 to 255, and, upon input of the numerical value from the keying section 5, the numerical value is stored as the voltage setting information S41 in the memory 4. In the computing section 3, the voltage setting information S41 set in the memory is compared with the battery voltage information S11 which has been subjected to A/D conversion in the battery voltage detecting section 1, followed by processing. The values 0 to 255 in the possible setting value range correspond respectively to voltages 3.3 V to 3.8 V, meaning that setting of a larger numerical value provides sounding of an alarm in an earlier stage.

In another embodiment of setting, the user may set information that the battery voltage alarm is sounded what minutes before the residual capacity of the battery becomes zero (the battery becomes unusable due to lowering of voltage). The time may be selected from 0 to 5 min in 1 min increments. That the present time is what minutes before the residual capacity of the battery becomes zero can be estimated to some extent based on the battery voltage at that time. In this embodiment of setting as well. the voltage setting information S41 stored in the memory 4 is converted to a numerical value in the range of from 0 to 255, although the screen in the setting by the user is displayed so that the time value is input.

Next, regarding the alarm setting information S42, the user selects one information from the choices displayed on the screen. The choices include no alarm, alarm 1. alarm 2, alarm 3, lighting of lamp, flashing of lamp and the like. In this case, for no alarm, the alarm for the residual capacity of the battery is not sounded at all; for alarm 1, the alarm for the residual capacity of the battery is sounded every 10 sec; for alarm 2, the alarm for the residual capacity of the battery is sounded every 20 sec; and for alarm 3, the alarm for the residual capacity of the battery is sound every 30 sec. For lighting of lamp. the call incoming lamp is lighted instead of the sounding of the alarm. and, for flashing of lamp, the call incoming lamp is flashed instead of the sounding of the alarm.

Regarding the method for giving the alarm, for the battery voltage, to the user, playing of music, increase or decrease in number of times of sounding, narrowing of sounding intervals and the like may be mentioned in addition to the above-described no alarm, alarm 1, alarm 2, alarm 3, lighting of lamp, and flashing of lamp. During waiting, the alarm for the battery voltage is sounded through a speaker 6a for information, while, during talking over the portable telephone set, the alarm for the battery voltage is sounded through a receiver 6b. When sounding the alarm through the speaker 6a, the computing section outputs alarm sound signal S31a to the speaker 6a. Similarly, when sounding the alarm through the receiver 6b, the computing section outputs alarm sound signal S31b to the receiver 6b. In the case of the lighting (or flashing) of lamp, the call incoming lamp is lighted (or flashed) independently of whether the portable telephone set is in the state of waiting or talking.

Figure 2:
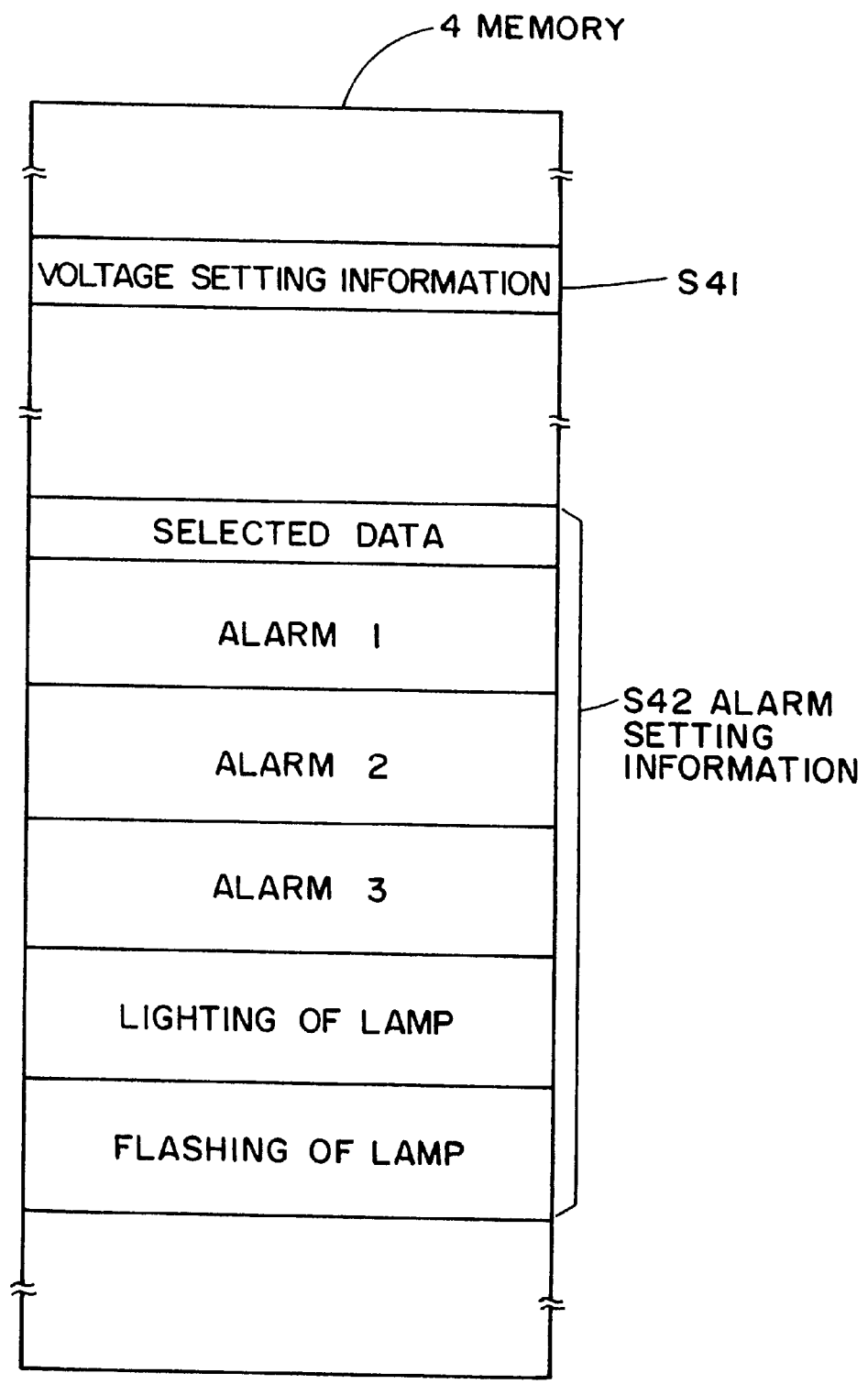
FIG. 2 is a diagram showing the construction of data on voltage setting information and alarm setting information in the memory in FIG. 1.

An embodiment of the construction of data on the voltage setting information S41 and the alarm setting information S42 in the memory 4 shown in FIG. 2 will be explained.

The voltage setting information S41 is one data constituted by several bits (for the above embodiment (0–255), 8 bits) stored in a certain memory region in the memory 4, and setting can be performed by rewriting the data. That is, the voltage setting information S41 in the memory 4 is constituted by data of about several bits only.

On the other hand, the alarm setting information S42 has data of several tens or several hundreds of bits by the number of the choices (alarm 1. alarm 2, . . . ). Further, there is selection data (several bits) for determining how to give the alarm from the choices, and the selection data is rewritten and set by the user. That is, when the alarm setting information S42 is withdrawn from the memory 4, the selection data is first read out, followed by selection and reading-out of the alarm setting information S42 based on the selection data.

In the alarm circuit for the residual capacity of a battery in a portable radio transmitting and receiving apparatus according to the present invention, when the voltage setting information is set at a higher value than that in the conventional alarm circuit, an alarm can be sounded in a stage where the residual capacity of the battery is larger than that in the conventional alarm circuit. Further, when sounding of an alarm in a decreased number of times of alarm sounding or lighting/flashing of the call incoming lamp is set as the alarm setting information, a problem involved in the prior art technique can be solved wherein once the alarm begins to sound, the sounding of the alarm continues until the circuit of the power source is broken, making it difficult to catch what the person talks.

The invention has been described in detail with particular reference to preferred embodiments, but it will be understood that variations and modifications can be effected within the scope of the present invention as set forth in the appended claims.

What is claimed is:

1. An alarm circuit for the residual capacity of a battery in a portable radio transmitting and receiving apparatus, comprising:

a memory for storing an alarm voltage of said battery, and a sound alarm generated through either a speaker or a receiver;

means for detecting a voltage of said battery to generate a detected voltage;

means for comparing said detected voltage with said alarm voltage to generate an alarm signal, when said detected voltage is lower than said alarm voltage to drive said speaker when said apparatus is in a waiting state and to drive said receiver when said apparatus is in a speaking state; and means for controlling one of said speaker and receiver to be driven in accordance with said sound alarm selected when said alarm signal is generated.

2. The alarm circuit as defined in claim 1, wherein;

said memory stores said alarm voltage and said alarm in accordance with input operation from a key board unit.

3. An alarm circuit, for the residual capacity in a portable radio transmitting and receiving apparatus, which monitors the output voltage of a battery used as a power source of the portable radio transmitting and receiving apparatus and, upon detection of a signal informing that the voltage approaches the lowest usable voltage of the portable radio transmitting and receiving apparatus, gives a sound alarm generated through either a speaker or a receiver to a user, wherein the alarm circuit comprises means, which registers voltage setting information for designating a battery voltage for initiating the alarming and registers alarm setting information for designating a method for outputting the alarm through said speaker when said apparatus is in a waiting state and through said receiver when said apparatus is in a speaking state, and, based on the user's designation, can set, as desired, a margin time, defined as the time taken from the initiation of the alarming to the point of time when the portable radio transmitting and receiving apparatus becomes actually unusable.

4. The alarming circuit according to claim 3, which comprises: memory means for storing the voltage setting information and alarm setting information; and a keying section that permits the voltage setting information and the alarm setting information to be keyed by the user and be stored in the memory, and permits the voltage setting information and alarm setting information stored in the memory to be varied.

5. The alarming circuit according to claim 3, which further comprises: a computing section that compares the voltage in the registered voltage setting information with the current battery voltage detected from the battery and, when the current battery voltage is lower than the preset voltage, outputs an alarm sound signal based on the alarm setting information to said speaker when said apparatus is in the waiting state or to said receiver when said apparatus is in the speakina state.

6. The alarming circuit according to claim 4, which further comprises: a computing section that compares the voltage in the registered voltage setting information with the current battery voltage detected from the battery and, when the current battery voltage is lower than the preset voltage, outputs an alarm sound signal based on the alarm setting information to said speaker when said apparatus is in the waiting state or to said receiver when said apparatus is in the speaking state.

7. The alarm circuit according to claim 5, wherein the alarm setting information further comprises a call incoming lamp signal output to a call incoming lamp instead of the alarm sound signal to either of the speaker or receiver to light or flash the call incoming lamp.

8. The alarm circuit according to claim 6, wherein the alarm setting information further comprises a call incoming lamp signal output to a call incoming lamp instead of the alarm sound signal to either of the speaker or receiver to light or flash the call incoming lamp.

9. The alarm circuit as defined in claim 1, further comprising a visual alarm, wherein the means for comparing alternatively generates the alarm signal for driving the visual alarm as controlled by the means for controlling.

10. The alarm circuit as defined in claim 9, wherein the visual alarm is a lamp used for indicating the receipt of a call.

* * * * *